United States Patent [19]
Lou

[11] Patent Number: 6,093,590
[45] Date of Patent: Jul. 25, 2000

[54] METHOD OF FABRICATING TRANSISTOR HAVING A METAL GATE AND A GATE DIELECTRIC LAYER WITH A HIGH DIELECTRIC CONSTANT

[75] Inventor: Chine-Gie Lou, Hsinchu Hsien, Taiwan

[73] Assignee: Worldwide Semiconductor manufacturing Corp., Hsinchu, Taiwan

[21] Appl. No.: 09/395,109

[22] Filed: Sep. 14, 1999

[51] Int. Cl.$^7$ ...................... H01L 21/336; H01L 21/8234
[52] U.S. Cl. ........................... 438/197; 438/585; 438/303
[58] Field of Search ................................ 257/368, 369; 438/183, 184, 197, 201, 299, 303, 585, 592, 595, 599

[56] References Cited

U.S. PATENT DOCUMENTS

| | | | |
|---|---|---|---|
| 3,878,549 | 4/1975 | Yamazaki et al. | 257/325 |
| 5,804,846 | 9/1998 | Fuller | 257/252 |
| 5,834,353 | 11/1998 | Wu | 438/287 |
| 5,960,270 | 9/1999 | Misra et al. | 438/197 |
| 5,966,597 | 10/1999 | Wright | 438/197 |
| 5,994,193 | 11/1999 | Gardner et al. | 438/303 |

*Primary Examiner*—Donald L. Monin, Jr.
*Assistant Examiner*—Hoai Pham
*Attorney, Agent, or Firm*—Jiawei Huang; J. C. Patents

[57] ABSTRACT

A method of fabricating a transistor. A first dielectric layer with a high dielectric constant is formed on a substrate. An oxide layer is formed on the first dielectric layer. A silicon nitride layer is formed on the oxide layer. The silicon nitride layer, the oxide layer, and the first dielectric layer are patterned to form a dummy gate structure. A spacer is formed on a sidewall of the dummy gate structure. The spacer and the dummy gate structure together form a dummy gate. An ion implantation step with the dummy gate serving as a mask and a thermal annealing step are performed to form a source region and a drain region on opposite sides of the dummy gate in the substrate. A second dielectric layer is formed next to the spacer. A top surface of the second dielectric layer is approximately level with a top surface of the dummy gate structure. The silicon nitride layer is removed. A nitridation process is performed to convert the oxide layer into a nitride layer. A metal barrier layer is formed over the substrate to cover the second dielectric layer, the spacer, and the nitride layer. A metal layer is formed on the metal barrier layer. A planarization process is performed to remove a portion of the metal layer and the metal barrier layer to form a metal gate. A top surface of the metal gate is level with a top surface of the second dielectric layer.

14 Claims, 3 Drawing Sheets

METHOD OF FABRICATING TRANSISTOR HAVING A METAL GATE AND A GATE DIELECTRIC LAYER WITH A HIGH DIELECTRIC CONSTANT

CROSS-REFERENCE TO RELATED APPLICATION

This application claims the priority benefit of Taiwan application serial no. 88114239, filed Aug. 20, 1999, the full disclosure of which is incorporated herein by reference.

BACKGROUND OF THE INVENTION

1. Field of the Invention

The present invention relates to a transistor fabrication method. More particularly, the present invention relates to a fabrication method for forming a transistor having a metal gate and a gate dielectric layer with a high dielectric constant.

2. Description of the Related Art

Advances in integrated devices have led to a size reduction in devices. In order to correspond with this fabrication trend, not only does the fabrication technique need to be improved, but also the materials must be changed.

For example, while forming a transistor, a silicon oxide layer formed by thermal oxidation is commonly used as a gate dielectric layer. In order to prevent a short channel effect and have a maximum drain current, the gate dielectric layer is reduced in thickness to about 30 angstroms.

However, for a transistor having a particular thin oxide layer serving as a gate dielectric layer, a high leakage current generated from the gate dielectric layer may occur. In order to prevent the leakage current, it is advantageous to have a dielectric layer with a high dielectric constant serving as a gate dielectric layer.

In addition, for a device having a size smaller than 400 mm$^2$, it is necessary to have a gate with a sheet resistance lower than 5 ohms/square unit ($\Omega/\square$) under the restriction of a word line delay of 2 nano-seconds.

Conventionally, the conductive material of the gate is polysilicon, which is quite compatible with the device fabrication process. However, the sheet resistance of the polysilicon gate is too high to achieve the above-described requirement. Thus, since a metal gate has a low sheet resistance, metallic material has becomes another preferred gate material.

Commonly, in a fabrication process for forming a transistor having a metal gate and a gate dielectric layer with a high dielectric constant, the source/drain region is formed after the gate is formed. The source/drain region is formed by first performing an ion implantation step with the gate serving as a mask, and then performing a thermal process to make the dopant spread homogeneously.

However, since the thermal process must be performed at a high temperature in order to make the dopant spread homogeneously, the reliability of the transistor is affected.

SUMMARY OF THE INVENTION

The invention provides an improved method of fabricating a transistor. A first dielectric layer with a high dielectric constant is formed on a substrate. An oxide layer is formed on the first dielectric layer. A silicon nitride layer is formed on the oxide layer. The silicon nitride layer, the oxide layer, and the first dielectric layer are patterned to form a dummy gate structure. A spacer is formed on a sidewall of the dummy gate structure. The spacer and the dummy gate structure together form a dummy gate. An ion implantation step with the dummy gate serving as a mask and a thermal annealing step are performed to form a source region and a drain region on opposite sides of the dummy gate in the substrate. A second dielectric layer is formed next to the spacer. A top surface of the second dielectric layer is approximately level with a top surface of the dummy gate structure. The silicon nitride layer is removed. A nitridation process is performed to convert the oxide layer into a nitride layer. A metal barrier layer is formed over the substrate to cover the second dielectric layer, the spacer, and the nitride layer. A metal layer is formed on the metal barrier layer. A planarization process is performed to remove a portion of the metal layer and the metal barrier layer to form a metal gate. A top surface of the metal gate is level with a top surface of the second dielectric layer.

Accordingly, the invention first forms a dummy gate structure including a gate dielectric layer having a high dielectric constant, an oxide layer, and a silicon nitride layer formed in sequence. A spacer is formed on a sidewall of the dummy gate structure. The spacer and the dummy gate structure together form a dummy gate. An ion implantation step with the dummy gate serving as a mask and a thermal annealing step are carried out to form a source region and a drain region on opposite sides of the dummy gate in the substrate. The silicon nitride layer of the dummy gate structure is removed. A nitridation step is performed to convert the oxide layer of the dummy gate structure into a nitride layer. The silicon nitride layer of the dummy gate structure is removed to leave a space for filling a metal barrier layer and a metal layer therein. A metal gate is formed.

The present invention forms the source region and the drain region before the formation of the metal gate by first forming the dummy gate. Thus, the thermal annealing step for forming the source region and the drain region is carried out before the formation of the metal gate. The reliability of the metal gate thus is enhanced.

The present invention forms a transistor having a gate dielectric layer with a high dielectric constant. Thus, the high leakage current generated from thin gate dielectric layer can be prevented, especially when the device sizes are reduced.

The invention forms a transistor having a metal gate. Since the metal gate has a low sheet resistance, a word line delay is effectively reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
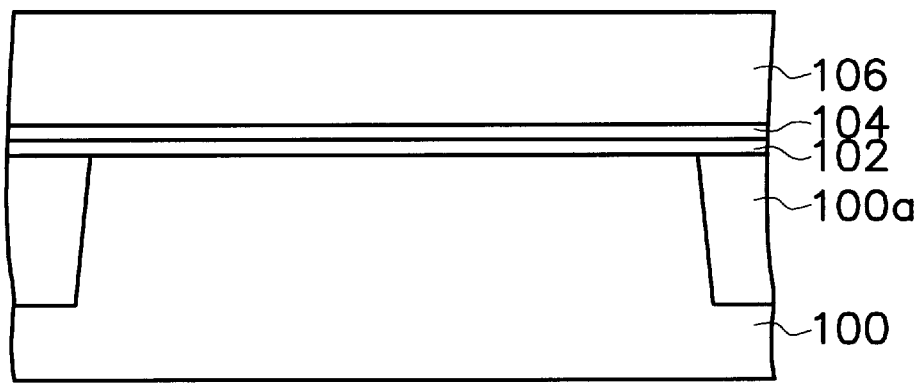
FIGS. 1A through 1G are schematic, cross-sectional views illustrating a method of fabricating a transistor having a metal gate and a gate dielectric layer with a high dielectric constant according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In FIG. 1A, a dielectric layer 102, an oxide layer 104, and a silicon nitride layer 106 are formed in sequence over the substrate 100. An isolation structure 100a is formed in a portion of the substrate 100. The isolation structure 100a can be, for example, a shallow trench isolation (STI) structure.

The dielectric layer 102 has a high dielectric constant. In the present invention, the dielectric layer 102 having a high dielectric constant is defined as having a dielectric constant higher than that of a commonly used dielectric layer, such as silicon nitride. The dielectric layer 102 having a high dielectric constant comprises a tantalum oxide ($Ta_2O_5$) having a dielectric constant of about 25. The oxide layer 104 comprises a high-temperature oxide (HTO) layer. The dielectric layer 102 having a high dielectric constant and the oxide layer 104 can be formed by, for example, chemical vapor deposition (CVD).

Figure 1B:
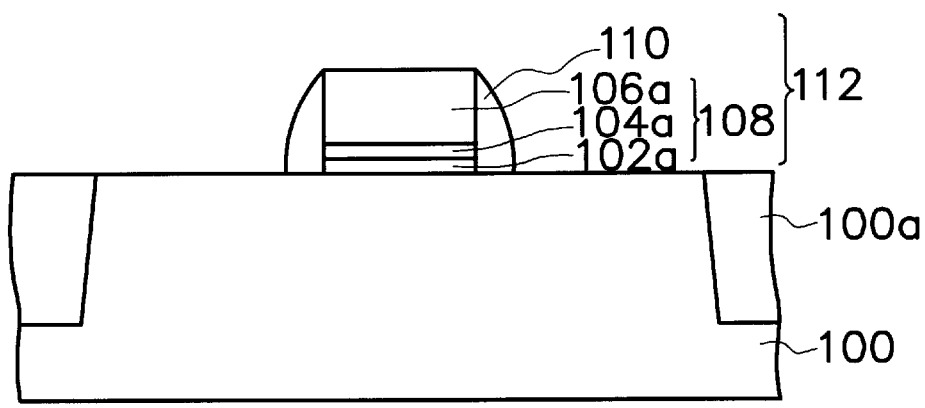

In FIG. 1B, a photolithographic and etching process is performed to pattern the dielectric layer 102 (FIG. 1), the oxide layer 104 (FIG. 1), the silicon nitride layer 106 (FIG. 1). A dielectric layer 102a having a high dielectric constant, an oxide layer 104a, and a silicon nitride layer 106a are left to form a dummy gate structure 108.

A spacer 110 is formed on a sidewall of the dummy gate structure 108. The spacer 110 and the dummy gate structure 108 are together formed a dummy gate 112. The material of the spacer 110 comprises silicon oxide. The spacer 110 can be formed by the following exemplary steps. A dielectric layer (not shown) is formed over the substrate 100 to cover the dummy gate structure 108. An etch back process is performed on the dielectric layer to form the spacer 110 on the sidewall of the dummy gate structure 108.

Figure 1C:
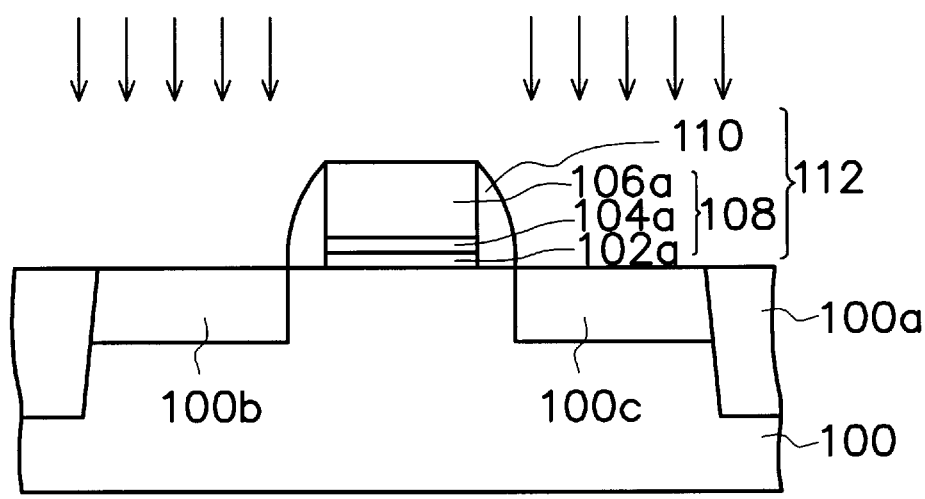

In FIG. 1C, a source region 100b and a drain region 110c are formed on opposite sides of the dummy gate 112 in the substrate 100. The source region 100b and the drain region 100c are formed by first performing an ion implantation step with the dummy gate 112 serving as a mask, and then performing a thermal annealing step.

Figure 1D:
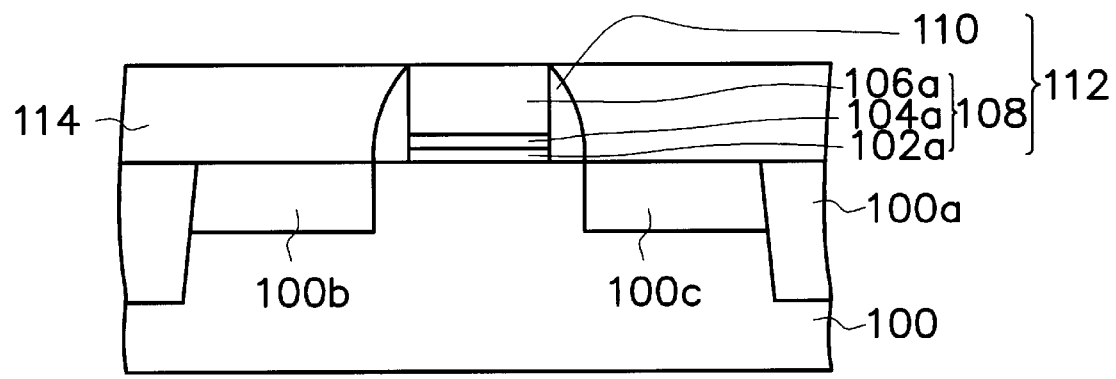

In FIG. 1D, a dielectric layer 114 is formed on the substrate 100 and next to the dummy gate 112. The top surface of the dielectric layer 114 is approximately level with the top surface of the dummy gate structure 108.

The dielectric layer 114 comprises a silicon oxide layer. The dielectric layer 114 can be formed by the following exemplary steps. A dielectric layer (not shown) is formed over the substrate 100 to cover the dummy gate 112 by, for example, chemical vapor deposition. A planarization process is performed with the silicon nitride layer 106a serving as a polishing stop layer. The dielectric layer, which is higher than the dummy gate 112 is removed.

The planarization process can be, for example, a chemical-mechanical polishing (CMP). The dielectric layer that is higher than the dummy gate 112 is removed with the silicon nitride layer 106a serving as a polishing stop layer.

The chemical-mechanical polishing process employs slurry. Preferably, the slurry has a polishing selectivity higher than 30 between the silicon oxide and the silicon nitride, in order to ensure that the polishing end point can be detected during chemical-mechanical polishing.

Figure 1E:
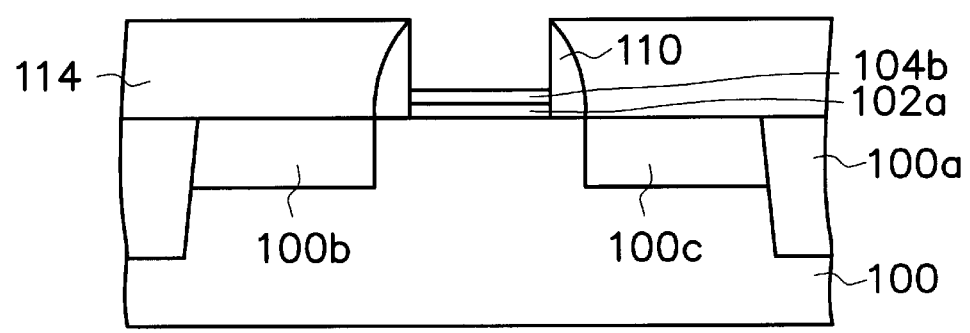

In FIG. 1E, the silicon nitride layer 106a of the dummy gate 112 is removed until the oxide layer 104a is exposed. Preferably, the silicon nitride layer 106a is removed by etching with the oxide layer 104a serving as an etching stop layer, so as to prevent the dielectric layer 102a from being etched. A nitridation process is performed on the exposed oxide layer 104a. The oxide layer 104a is converted into a nitride later 104b. The nitride layer 104b comprises a silicon oxynitride (SiON) layer or silicon nitride layer.

The silicon nitride layer 106a can be removed by, for example, wet etching. Preferably, the nitridation process is carried out in an ammonia ($NH_3$) environment.

Figure 1F:
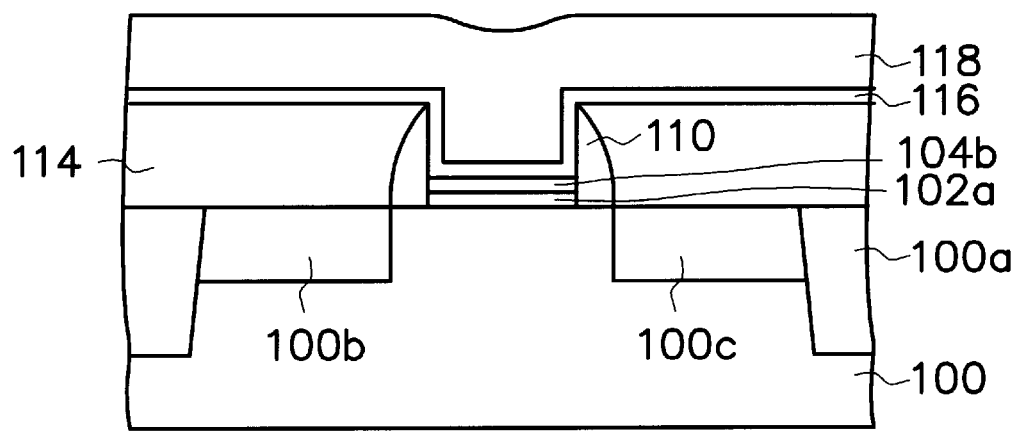

In FIG. 1F, a metal barrier layer 116 is formed to cover the dielectric layer 114, the spacer 110, and the nitride layer 104b. A metal layer 118 is formed on the metal barrier layer 116.

The metal barrier layer 116 comprises a titanium nitride layer. The metal barrier layer 116 can be formed by, for example, sputtering. The metal layer 118 comprises a tungsten layer. The metal layer 118 can be formed by, for example, chemical vapor deposition.

Figure 1G:
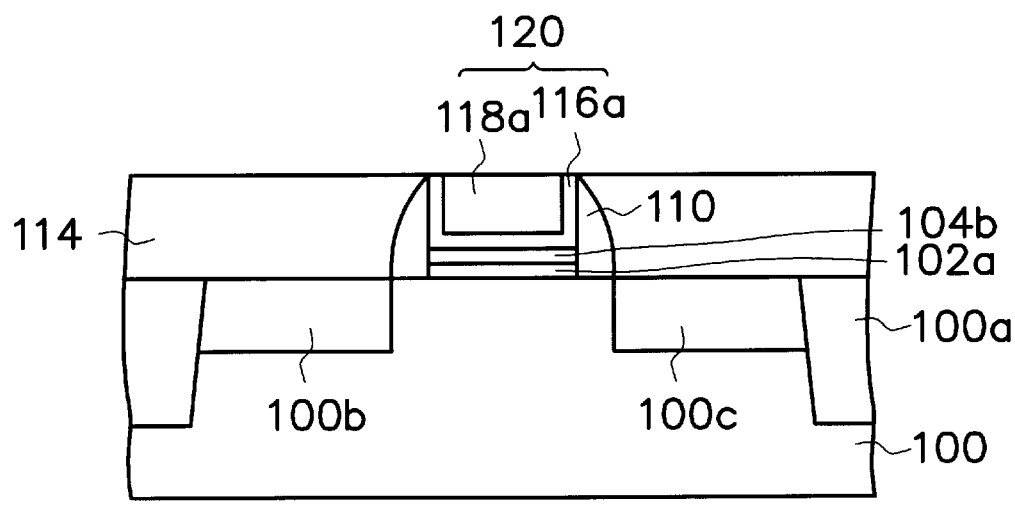

In FIG. 1G, a planarization process is performed to remove a portion of the metal layer 118 and a portion of the metal barrier layer 116 until the dielectric layer 114 is exposed. A remaining metal barrier layer 116a and a remaining metal layer 118a are left to form a metal gate 120 which has a top surface level with a top surface of the dielectric layer 114.

The planarization step preferably is a chemical-mechanical polishing step performed with the dielectric layer 114 serving as a polishing stop layer.

Accordingly, the invention first forms a dummy gate structure including a gate dielectric layer having a high dielectric constant, an oxide layer, and a silicon nitride layer formed in sequence. A spacer is formed on a sidewall of the dummy gate structure. The spacer and the dummy gate structure together form a dummy gate. An ion implantation step with the dummy gate serving as a mask and a thermal annealing step are carried out to form a source region and a drain region on opposite sides of the dummy gate in the substrate. The silicon nitride layer of the dummy gate structure is removed. A nitridation step is performed to convert the oxide layer of the dummy gate structure into a nitride layer. The silicon nitride layer of the dummy gate structure is removed to leave a space for filling a metal barrier layer and a metal layer therein. A metal gate is formed.

The present invention forms the source region and the drain region before forming the metal gate by first forming the dummy gate. Thus, the thermal annealing step for forming the source region and the drain region is carried out before the formation of the metal gate. The reliability of the metal gate thus is enhanced.

The present invention forms a transistor having a gate dielectric layer with a high dielectric constant. Thus, the high leakage current generated from thin gate dielectric layer can be prevented especially when the device sizes are reduced.

The invention forms a transistor having a metal gate. Since the metal gate has a low sheet resistance, the delay of word line is effectively reduced.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a transistor, comprising:

forming a first dielectric layer with a high dielectric constant on a substrate;

forming an oxide layer on the first dielectric layer;

forming a silicon nitride layer on the oxide layer;

patterning the silicon nitride layer, the oxide layer, and the first dielectric layer to form a dummy gate structure;

forming a spacer on a sidewall of the dummy gate structure, wherein the spacer and the dummy gate structure together form a dummy gate;

performing an ion implantation step with the dummy gate serving as a mask and performing a thermal annealing step to form a source region and a drain region on opposite sides of the dummy gate in the substrate;

forming a second dielectric layer next to the spacer, wherein a top surface of the second dielectric layer is approximately level with a top surface of the dummy gate structure;

removing the silicon nitride layer of the dummy gate structure;

performing a nitridation process to convert the oxide layer into a nitride layer;

forming a metal barrier layer over the substrate to cover the second dielectric layer, the spacer, and the nitride layer;

forming a metal layer on the metal barrier layer; and performing a planarization process to remove a portion of the metal layer and the metal barrier layer to form a metal gate, wherein a top surface of the metal gate is level with a top surface of the second dielectric layer.

2. The method of claim 1, wherein the first dielectric layer comprises a tantalum oxide ($Ta_2O_5$) layer.

3. The method of claim 1, wherein the oxide layer comprises a high-temperature oxide layer.

4. The method of claim 1, wherein a material of the spacer comprises silicon oxide.

5. The method of claim 1, wherein the second dielectric layer comprises a silicon oxide layer.

6. The method of claim 1, wherein steps of forming the second dielectric layer comprise:

forming a third dielectric layer over the substrate to cover the dummy gate; and performing a chemical-mechanical polishing process on the third dielectric layer.

7. The method of claim 1, wherein the nitridation process is performed in an ammonia environment.

8. The method of claim 1, wherein a material of the metal barrier layer comprises titanium nitride.

9. The method of claim 1, wherein a material of the metal layer comprises tungsten.

10. A method of forming a transistor comprising:

forming a dielectric layer having a high dielectric constant on a substrate;

forming a high-temperature oxide layer on the dielectric layer;

forming a silicon nitride layer on the high-temperature oxide layer;

patterning the silicon nitride layer, the high-temperature oxide layer, and the dielectric layer to form a dummy gate structure;

forming a silicon oxide spacer on a sidewall of the dummy gate structure, wherein the silicon oxide spacer and the dummy gate structure together form a dummy gate;

performing an ion implantation step with the dummy gate serving as a mask and a thermal annealing step to form a source region and a drain region on opposite sides of the dummy gate in the substrate;

forming a silicon oxide layer next to the silicon oxide spacer, wherein a top surface of the silicon oxide layer is approximately level with a top surface of the dummy gate structure;

removing the silicon nitride layer of the dummy gate structure;

performing a nitridation process to convert the high-temperature oxide layer into a nitride layer;

forming a metal barrier layer cover the silicon oxide layer, the silicon oxide spacer, and the nitride layer;

forming a metal layer on the metal barrier layer; and performing a chemical-mechanical polishing step on the metal layer and the metal barrier layer to form a metal gate, wherein the chemical-mechanical polishing step is performed with the silicon oxide layer serving as a polishing stop, and a top surface of the silicon oxide layer is approximately level with a top surface of the metal gate.

11. The method of claim 10, wherein the dielectric layer comprises a tantalum oxide ($Ta_2O_5$) layer.

12. The method of claim 10, wherein the nitridation process is performed in an ammonia environment.

13. The method of claim 10, wherein the material of the metal barrier layer comprises titanium nitride.

14. The method of claim 10, wherein a material of the metal layer comprises tungsten.

* * * * *